United States Patent [19]
Handy et al.

[11] Patent Number: 5,126,975
[45] Date of Patent: Jun. 30, 1992

[54] INTEGRATED CACHE SRAM MEMORY HAVING SYNCHRONOUS WRITE AND BURST READ

[75] Inventors: James E. Handy; Kelly A. Maas, both of San Jose, Calif.

[73] Assignee: Integrated Device Technology, Inc., Santa Clara, Calif.

[21] Appl. No.: 602,507

[22] Filed: Oct. 24, 1990

[51] Int. Cl.⁵ .............................................. G11C 7/00
[52] U.S. Cl. ........................... 365/230.01; 365/230.08; 365/233
[58] Field of Search .................. 365/189.01, 230.01, 365/189.02, 233, 230.08

[56] References Cited
U.S. PATENT DOCUMENTS 4,926,385  5/1990  Fujishima et al. ............. 365/230.08

OTHER PUBLICATIONS

Communication Update, Integrated Device Technology, Santa Clara, California, Nov. 14, 1989.
Electronic Design, article entitled "Design a Secondary Cache for Intel's 80486 Processor", by Jim Handy.
Integrated Device Technology, IDT 71XXXS Product Proposal, CMOS Cache RAM 256K Burst Counter and Self-Timed Write.
Motorola Semiconductor Technical Data, pp. 5-25 and 5-29, 16K × 4 Bit Synchronous Static RAM with Transparent Outputs.
Article from Design, entitled "Intel's 486: a cache 22?".

Primary Examiner—Terrell W. Fears
Attorney, Agent, or Firm—Limbach & Limbach

[57] ABSTRACT

An integrated cache memory device using SRAM cells is disclosed. The integrated cache memory has synchronized write capability and burst read capability.

8 Claims, 6 Drawing Sheets

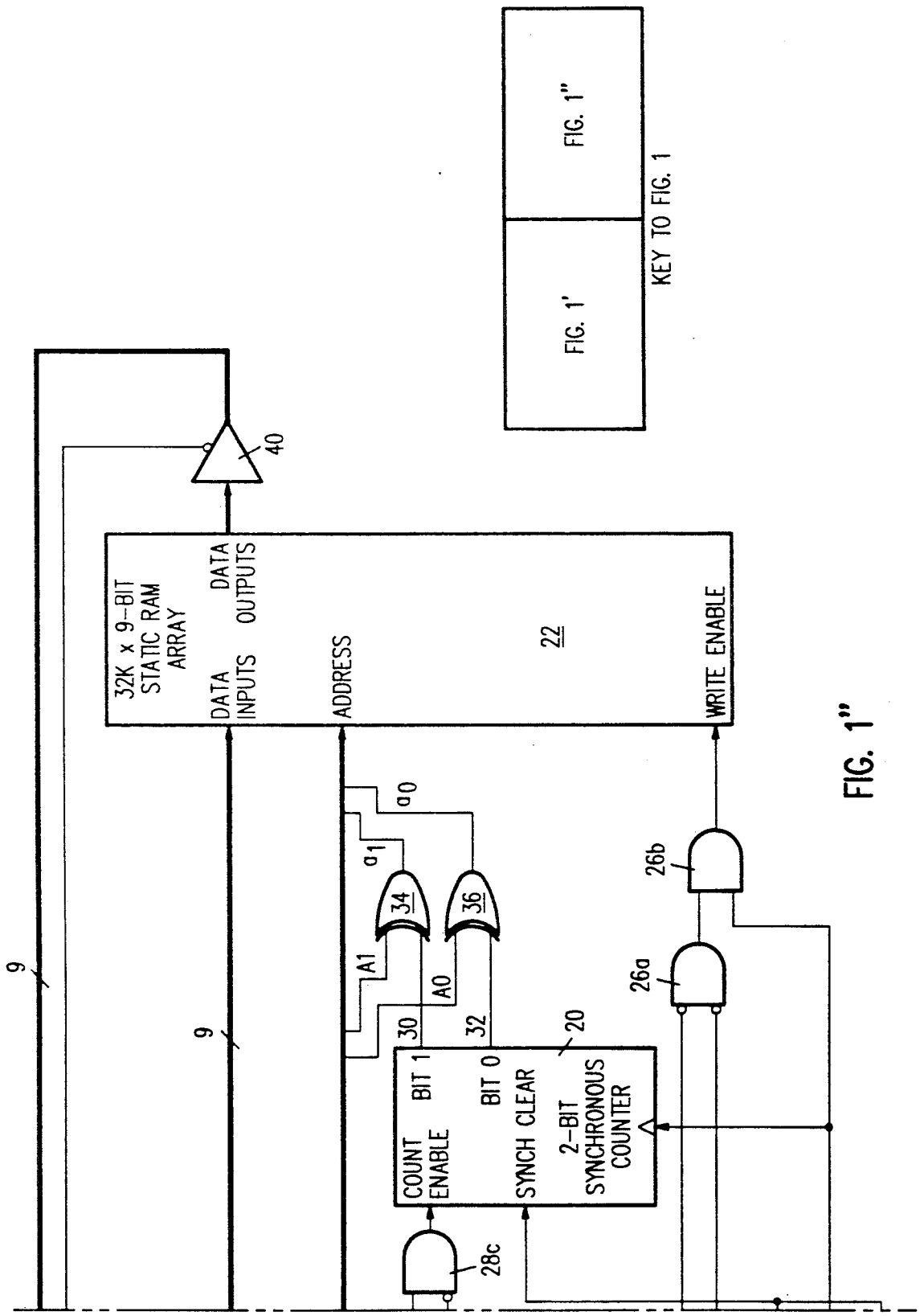

INTEGRATED CACHE SRAM MEMORY HAVING SYNCHRONOUS WRITE AND BURST READ

TECHNICAL FIELD

The present invention relates to an integrated SRAM memory and more particularly to an SRAM memory having synchronous write and burst read capabilities.

BACKGROUND OF THE INVENTION

SRAM (Static Random Access Memory) devices are well known in the art. A typical SRAM device comprises an array of memory cells with each SRAM cell containing a binary digit (bit) of data. An SRAM cell holds the data in a latch. The latch holds the bit information so long as power is supplied to the cell. Since an SRAM cell can hold the data information indefinitely so long as power is supplied thereto, it can be interrogated either by read or write, at any time. Thus, it is typically an asynchronous device.

However, it is also known in the prior art to provide a single integrated SRAM device with a synchronized write capability. In such a mode of operation, the SRAM device writes only in the presence of a clock signal. Thus its operation is synchronized to that of a clock signal.

Finally, it is known in the prior art to provide an integrated asynchronous SRAM memory array device with discrete logic circuits, i.e. non-single integrated circuit, to provide for burst read, i.e. a single address to the SRAM memory array device causes a plurality of data signals to be read from the SRAM memory array device. However, the use of discrete logic circuits with their inherent delay preclude the use of an SRAM with discrete logic circuits as cache memory devices to processors, with zero wait state.

Another type of prior art single integrated memory device is a DRAM. A DRAM memory device also comprises an array of memory cells. However, each DRAM memory cell stores the data in a capacitor which must be periodically refreshed. This refreshing of the cell of a DRAM device is performed periodically.

However, some DRAM devices do provide the capability of performing a nibble mode read. That is, in a read mode, a DRAM device is capable of supplying on its output a plurality of data bits from a plurality of different cell locations in response to cycling a single input to the DRAM device. Although a single integrated DRAM memory device is capable of performing a nibble mode read, it accomplishes this by dividing the DRAM array into a plurality of subarrays with the same address supplied to each of the subarrays. In this manner, the data from the same address location but from a plurality of different subarrays are read out from the DRAM.

Finally, in part because the SRAM device does not need refreshing, it operates faster than a DRAM device. In addition, a DRAM device uses multiplexed address. Thus, in many applications, such as cache memory, SRAM devices are preferred over DRAM devices because of their speed. As processor speed exceeds that of memory speed, it becomes increasingly desirable to have a cache memory acting as a buffer between the processor and the main memory. The cache memory would have the speed which can keep up with the speed of the processor.

SUMMARY OF THE INVENTION

The present invention relates to a single integrated memory circuit device which is responsive to a clock signal, an external address signal, and an external write enable signal. The device has an address register for storing the external address signal. The device also has an SRAM memory array for storing a plurality of digital binary data in an array. The memory array is operable in two states, and is responsive to an internal write enable signal, having the two states. In a read state, the memory array is responsive to an internal address signal and generates a plurality of internal data signals from the array in response thereto. In a write state, the array is responsive to the internal address signal and stores the internal data signal into the array. The memory array further comprises logic means which is responsive to the clock signal, the external address signals, and the external write enable signal and generates the internal write enable signal, and the internal address signal. The logic means, in one state, generates the internal write enable signal synchronous with the internal address signal and causes the memory array to be operable in the write state. In another state, the logic means responds to the externally supplied address signal and causes the memory array to be operable in the read state.

DETAILED DESCRIPTION OF THE DRAWINGS

Figure 1:
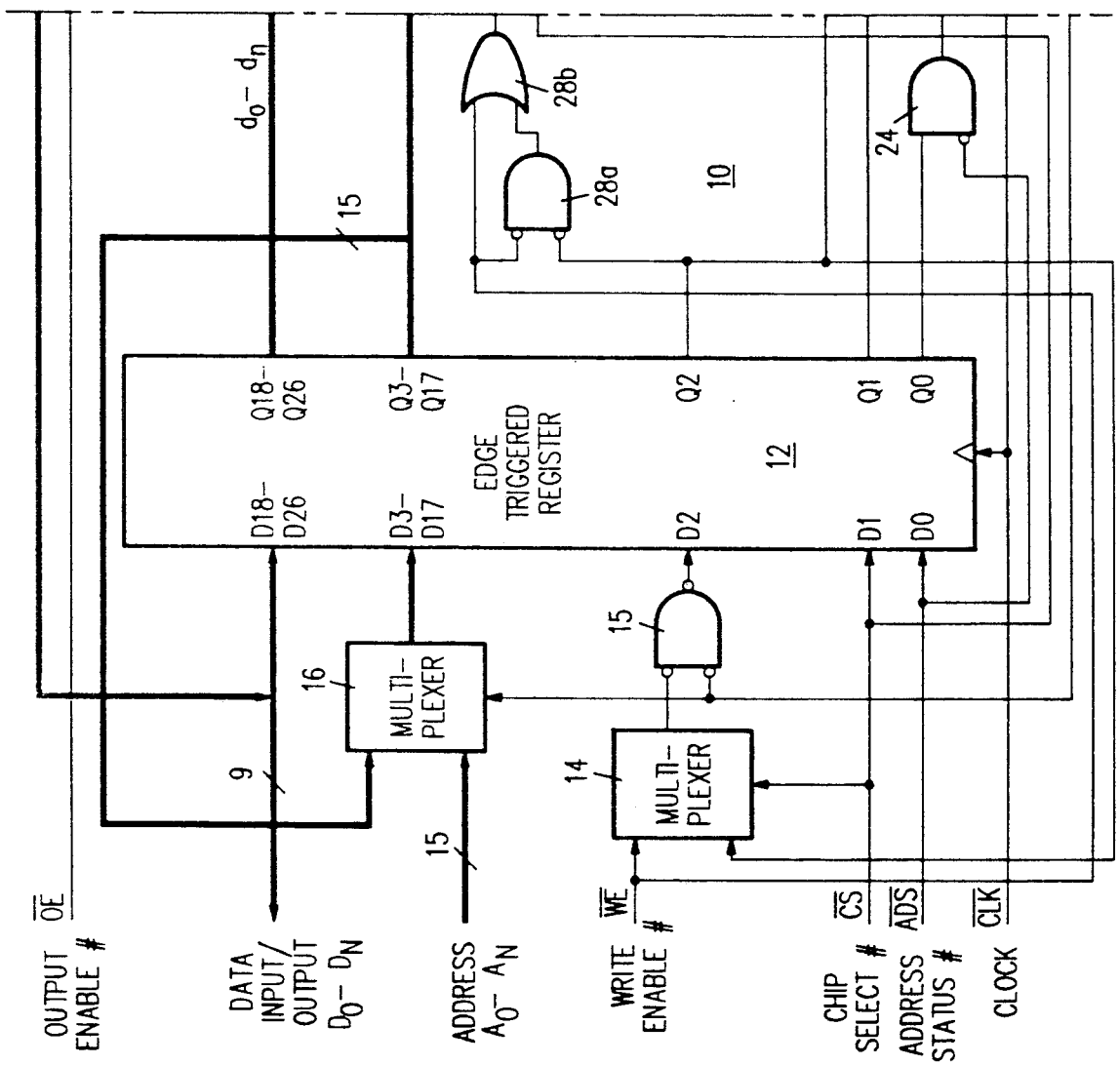
FIG. 1 made up of FIG. 1' and FIG. 1" is a schematic diagram showing the integrated memory device of the present invention.

Referring to FIG. 1, there is shown an integrated memory device 10 of the present invention. The integrated memory device 10 is a single integrated circuit device comprised of well known semiconductive material. It receives a plurality of signal and data lines which are shown in FIG. 1 and are described as follows:

$A_0-A_N$ These are external address lines supplying external address signals to the memory device 10.

CLK This is a clock signal.

$\overline{ADS}$ This is an address status signal and is an active low signal.

$\overline{WE}$ Write enable signal. This signal is active low and when active signifies a write operation.

$\overline{CS}$ Chip select signal. This signal is active low and when active enables the write cycle and the burst counter.

$\overline{OE}$ This is Output Enable signal and is active low.

$D_0-D_N$ These are the external data lines which supply external data signals to and from the integrated memory device 10.

The active low signals supplied to the device 10 of the present invention are shown by the symbol "#" in the drawing.

The device 10 comprises a 27 input positive edge triggered register 12. The $\overline{ADS}$ signal is supplied to the $D_0$ input of the register 12. The $\overline{CS}$ signal is supplied to the $D_1$ input of the register 12. The $\overline{WE}$ signal is supplied to a first input of a first multiplexer 14. The output of the first multiplexer 14 is supplied as an input to a NAND gate 15. The output of the NAND gate 15 is supplied to the $D_2$ input of the register 12. The external address signals $A_0$-$A_N$ are supplied to a second multiplexer 16. The outputs of the second multiplexer 16 are supplied to the $D_3$-$D_{17}$ inputs of the register 12. The external data signals $D_0$-$D_N$ are supplied to the $D_{18}$-$D_{26}$ inputs of the register 12.

The signals are all clocked into the register 12 by the clock CLK signal. The output of the registers 12 are formed at the corresponding Q output.

The device 10 also comprises a counter 20 and an SRAM memory array 22. In the preferred embodiment, the bit counter 20 is two bits, and the SRAM memory array 22 is 32K × 9.

The $Q_0$ output of the register 12 is gated into an AND gate 24. The inverse $\overline{ADS}$ signal provides another input to the AND gate 24. The output of the AND gate 24 is supplied to the counter 20 as the synch clear signal. In addition, it is used to control the second multiplexer 16. Finally, it is also supplied to a second input to the NAND gate 15.

The CLK, and $Q_1$, $Q_2$, and $Q_3$ outputs of the register 12 are supplied to a series of logic gates 26($a$ and $b$) and is used to generate the internal Write enable signal. The internal write enable signal is supplied to the memory array 22 and is used to control the read/write of the array 22.

The $\overline{WE}$ signal, the $Q_2$ output of the register 12, and the $\overline{CS}$ signal are gated into a series of gates 28($a$-$c$) and is supplied to the count enable of the counter 20.

The CLK signal is also supplied to the two bit counter 20. The two bit counter 20 has a most significant bit (MSB) output 30 and a least significant bit (LSB) output 32. The most significant bit output 30 is supplied to a first exclusive OR gate 34 to which the output from the address register 12 corresponding to the external address signal $A_1$ is also supplied. The output of the first exclusive OR gate 34 is the internal address signal $a_1$. The least significant bit output 32 of the counter 20 is supplied to a second exclusive OR gate 36. The output of the address register 12 which corresponds to the externally supplied external address signal $A_0$ is also supplied to the other input of the second exclusive OR gate 36. The output of the second exclusive OR gate 36 is the internal address signal $a_0$.

The outputs $Q_5$-$Q_{17}$ of the address register 12 are address signals $a_2$-$a_N$ and they correspond to the external address signals $A_2$-$A_N$. Collectively, the internal address signals $a_0$-$a_N$ are supplied as the internal address signals to the memory array 22.

The $Q_3$-$Q_{17}$ outputs of the register 12, which correspond to the external address signals $A_0$-$A_N$ are also supplied back to the second multiplexer 16.

Each of the cells of the memory array 22 holds or stores one binary digit or bit of information. The location of the SRAM cells in the memory array 22 is determined by the internal address signals $a_0$-$a_N$. Each address of the internal address signals $a_0$-$a_N$ accesses 9 bits of information. For a 32K × 9 memory array, there are 15 internal address signal lines.

There are nine internal data signal lines $d_0$-$d_N$ supplied to the memory array 22. The internal data signal lines $d_0$-$d_N$ are supplied from the $Q_{18}$-$Q_{26}$ outputs of the register 12.

Finally, the data output of the memory array 22 is also supplied to an output buffer amplifier 40. The output buffer amplifier 40 outputs the internal data signals $d_0$-$d_N$ on to the external data signals $D_0$-$D_N$. The output buffer amplifier 40 is controlled by the output enable or $\overline{OE}$.

The signal conditions of the rising edge of the clock for various cycles are set forth below.

|     | Load Address | Read Cycle | Write Cycle |
| --- | --- | --- | --- |
| ADS | Low (high last time) | High* | High* |
| $\overline{CS}$ | Don't Care | Low | Low |
| $\overline{WE}$ | Don't Care | High | Low |
| $\overline{OE}$ | Don't Care | Low | High |

*Can be Low too, provided it was sampled low on last cycle

The integrated memory device 10 of the present invention has two states of operation: a read state or a read mode, and a write state or a write mode. The operation of the integrated memory device 10 with respect to each of the modes will now be explained.

READ MODE

In this mode of operation, all inputs to the register 12 are clocked into the register 12 on the rising edge of the clock input. The register 12's data contents are updated every clock cycle.

The address inputs are routed to the register 12 only when directed to do so by the output of the AND gate 24. If the output of the AND gate 24 indicates that the address in the register 12 is not to be changed, the second multiplexer 16 is instructed to route the $Q_3$-$Q_{17}$ output of register 12 back to the $D_3$-$D_{17}$ inputs of the register 12, so the register contents do not change from clock to clock.

Because this is a read cycle, $\overline{WE}$ signal would remain high indicating an inactive state. Thus, the output of the $Q_2$ register 12 would be high. The internal write enable, i.e. output of gate 26$b$, would be low. Since the internal write enable is active high, this would be inactive.

The counter 20 counts the sequence 0,1,2,3,0 . . . on the rising edge of the clock input. If the synchronous clear is active (activated by the output of the AND gate 24), the counter 20 is reset to zero, on the rising edge of the of the clock input. The count enable input must be active during the clock rising edge to allow the counter 20 to increment.

The counting logic circuit 28 allows counting only under certain conditions. First the counter 20 may increment any time the $\overline{CS}$ signal is active and the $\overline{WE}$ signal is inactive. Second, if both the $\overline{WE}$ signal and the $\overline{CS}$ signal are active, the counter 20 is allowed to increment only if the $\overline{WE}$ signal was also active during the last cycle the $\overline{CS}$ signal was active. This is assured by gating into the register 12 the earlier state of the $\overline{WE}$ signal through the first multiplexer 14, so that the register 12 contains a copy of the status of the $\overline{WE}$ signal during the previous $\overline{CS}$.

During the read operation, the clock CLK signal continues to operate cyclically. With each cycle, the counter 20 increments its count. Since the counter 20 is a two bit counter, the most significant bit 30 and the least significant bit 32 combine to have four possible states. Depending upon the initial external address signal $A_1$ and $A_0$, the internal address $a_1$ and $a_0$ would have the following states:

| $A_1$ | $A_0$ | 30 | 32 | $a_1$ | $a_0$ |
|---|---|---|---|---|---|
| Cycle 0 | | | | | |
| 0 | 0 | 0 | 0 | 0 | 0 |
| 0 | 0 | 0 | 1 | 0 | 1 |
| 0 | 0 | 1 | 0 | 1 | 0 |
| 0 | 0 | 1 | 1 | 1 | 1 |
| Cycle 1 | | | | | |
| 0 | 1 | 0 | 0 | 0 | 1 |
| 0 | 1 | 0 | 1 | 0 | 0 |
| 0 | 1 | 1 | 0 | 1 | 1 |
| 0 | 1 | 1 | 1 | 1 | 0 |
| Cycle 2 | | | | | |
| 1 | 0 | 0 | 0 | 1 | 0 |
| 1 | 0 | 0 | 1 | 1 | 1 |
| 1 | 0 | 1 | 0 | 0 | 0 |
| 1 | 0 | 1 | 1 | 0 | 1 |
| Cycle 3 | | | | | |
| 1 | 1 | 0 | 0 | 1 | 1 |
| 1 | 1 | 0 | 1 | 1 | 0 |
| 1 | 1 | 1 | 0 | 0 | 1 |
| 1 | 1 | 1 | 1 | 0 | 0 |

From the foregoing, it can be seen that for each external address signal $A_0$–$A_N$, three other adjacent address signals are subsequently generated. Thus, for each read state, data from four contiguous memory locations from the memory array 22 are read out of the memory array 22. They are supplied onto the internal address signal lines $d_0$–$d_N$ and is gated by the output amplifier 40.

Figure 2:
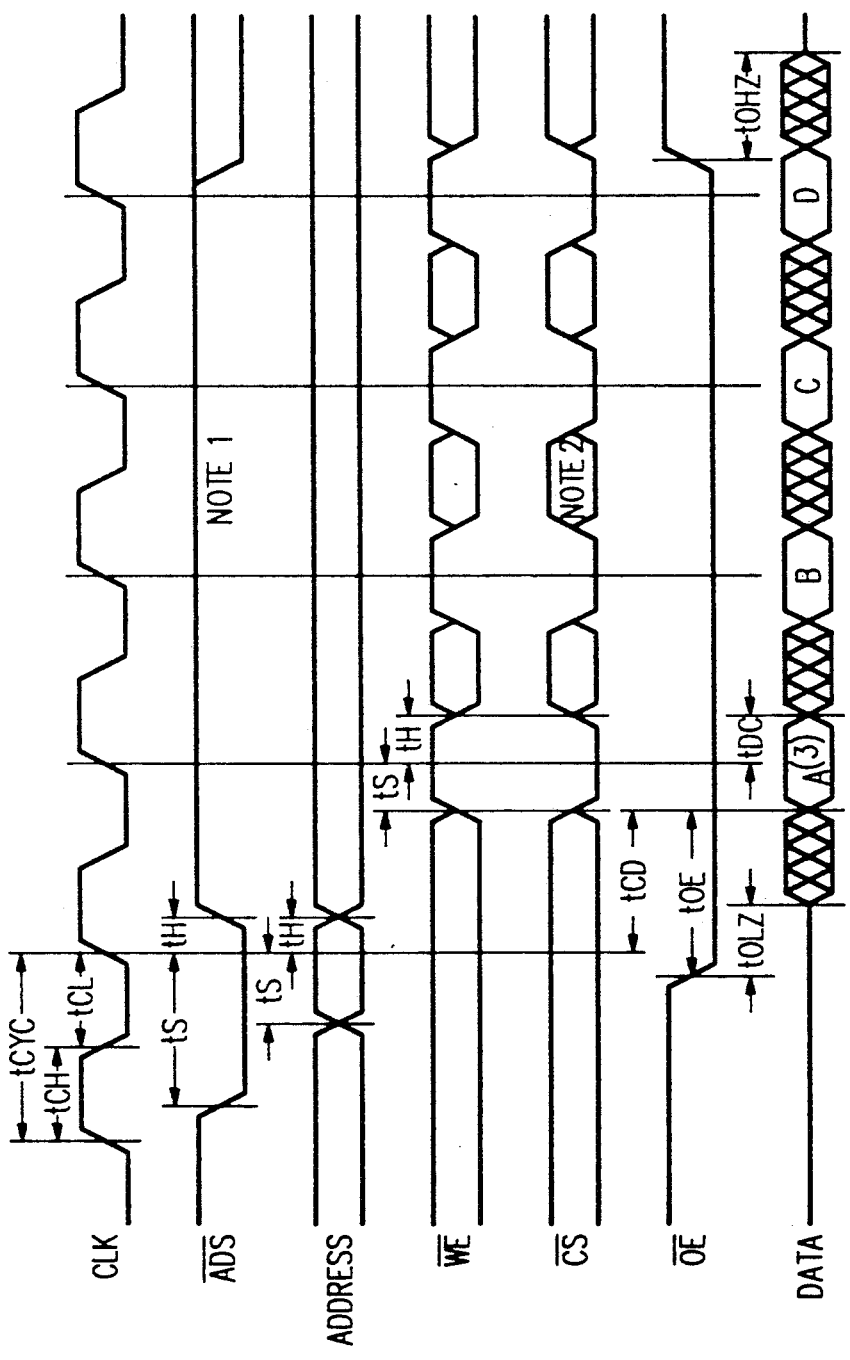
FIG. 2 is a timing diagram showing the various signals supplied to the integrated memory device of the present invention in the burst read mode.

A timing diagram showing the various signals in the read operation is shown in FIG. 2, wherein the following is to be noted.

1. If $\overline{ADS}$ goes low during a burst cycle, a new address will be loaded and another burst cycle will be started.

2. If $\overline{CS}$ is taken inactive during a burst read cycle, the burst counter will discontinue counting until $\overline{CS}$ input again goes active.

3. A-Data from input address. B-Data from input address except $A_0$ is now $\overline{A_0}$. C-Data from input address except $A_1$ is now $\overline{A_1}$. D-Data from input address except $A_0$ and $A_1$ are now $\overline{A_0}$ and $\overline{A_1}$

WRITE MODE

In this mode of operation, all inputs to the register 12 are clocked into the register 12 on the rising edge of the clock input. The data contents of register 12 are updated every clock cycle.

The address inputs are routed to the register 12 only when directed to do so by the output of the AND gate 24. If the output of the AND gate 24 indicates that the address in the register 12 is not to be changed, the second multiplexer 16 is instructed to route the $Q_3$–$Q_{17}$ output of register 12 back to the $D_3$–$D_{17}$ inputs of the register 12, so the register contents do not change from clock to clock. At the same time, a high level is forced into the $\overline{WE}$ register bit $D_2$ of register 12. This keeps the counter from incrementing on the first write cycle, after the address register ($D_3$–$D_{17}$) has been updated, and is used to drive the logic circuit 26 to disallow write pulse generation during the cycle where the address register ($D_3$–$D_{17}$) is being updated.

Similarly the $\overline{WE}$ signal is supplied to the first multiplexer 14. The $Q_2$ output of the register 12 is also supplied to the multiplexer 14. The multiplexer 14 is controlled by the $\overline{CS}$ signal. Thus, the $D_2$ input of register 12 is updated only when the $\overline{CS}$ signal directs the $\overline{WE}$ signal to be supplied as the output of the second multiplexer 14. On clock rising edges where the $\overline{CS}$ signal is not active, the second multiplexer 14 is instructed to route the $Q_2$ output back to the second multiplexer 14, and the $Q_2$ output of register 12 remains the same. This bit is used in generating a self-timed write pulse, i.e. a write function synchronous with the CLK signal, and to help control the counter increment function.

The $\overline{ADS}$ signal is shaped by the AND gate 24 so that the $\overline{ADS}$ signal is recognized on those cycles where it goes low, and was registered as having been high in the preceding cycle. The output of the AND gate 24 is used to clear the counter 20 and to redirect the second multiplexer 16.

The internal write enable signal is activated and is supplied to the memory array 22 during those cycles when both the $\overline{WE}$ signal and the $\overline{CS}$ signal have been gated into the register 12 and determined to be active, and the output of the AND gate 24 is low. The logic circuit 26 combines the $\overline{WE}$ and $\overline{CS}$ signals with the high half of the CLK signal to generate a single internal write pulse on the write enable line.

Figure 3:
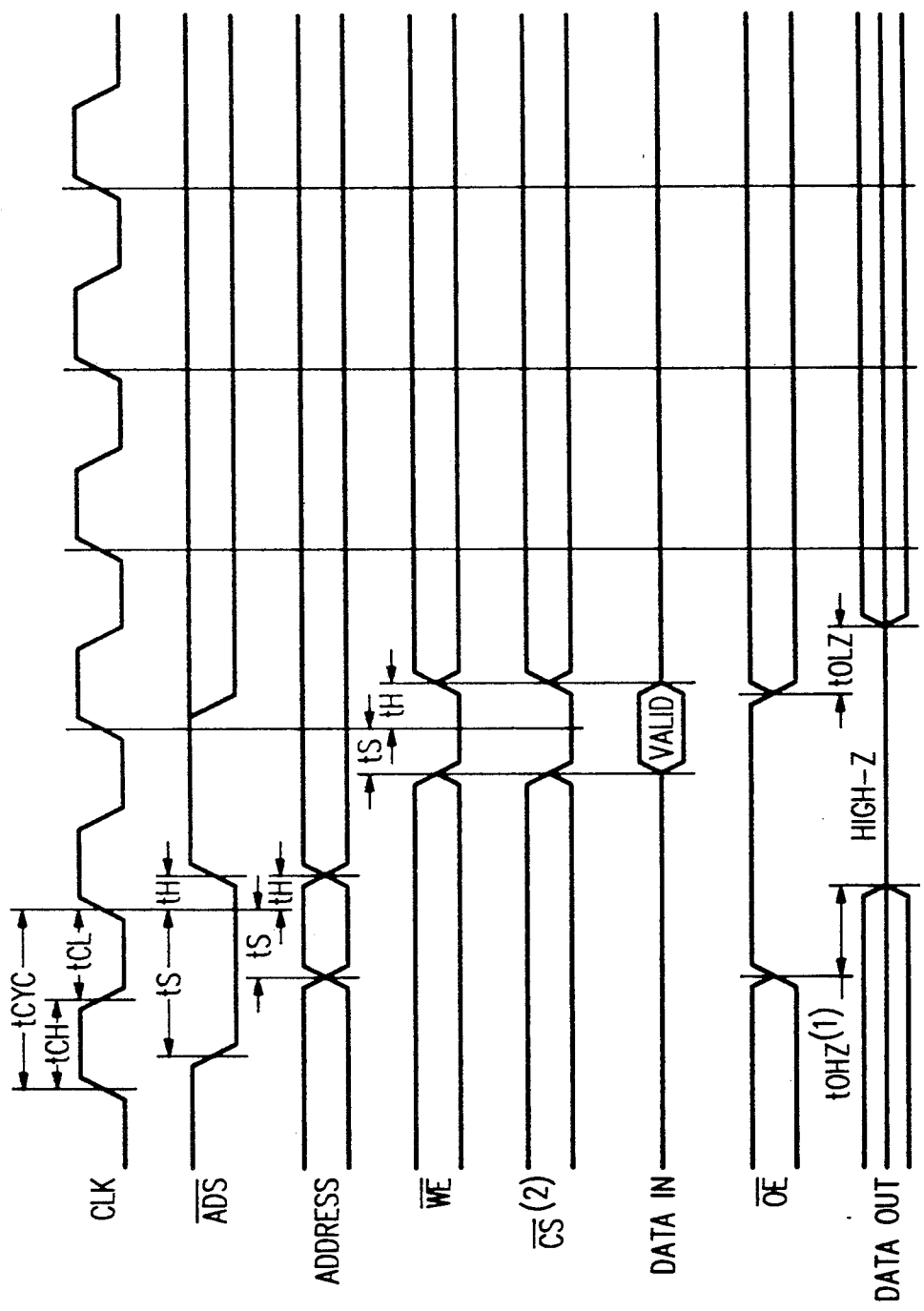
FIG. 3 is a timing diagram showing the various signals supplied to the integrated memory device of the present invention in the synchronous write mode.

A timing diagram showing the various signals in the write operation is shown in FIG. 3, wherein the following is to be noted.

1. $\overline{OE}$ must be taken inactive before the second rising clock edge of write cycle.

2. $\overline{CS}$ timing is the same as any synchronous signal when used to block write or to stop the burst count sequence.

Figure 4:
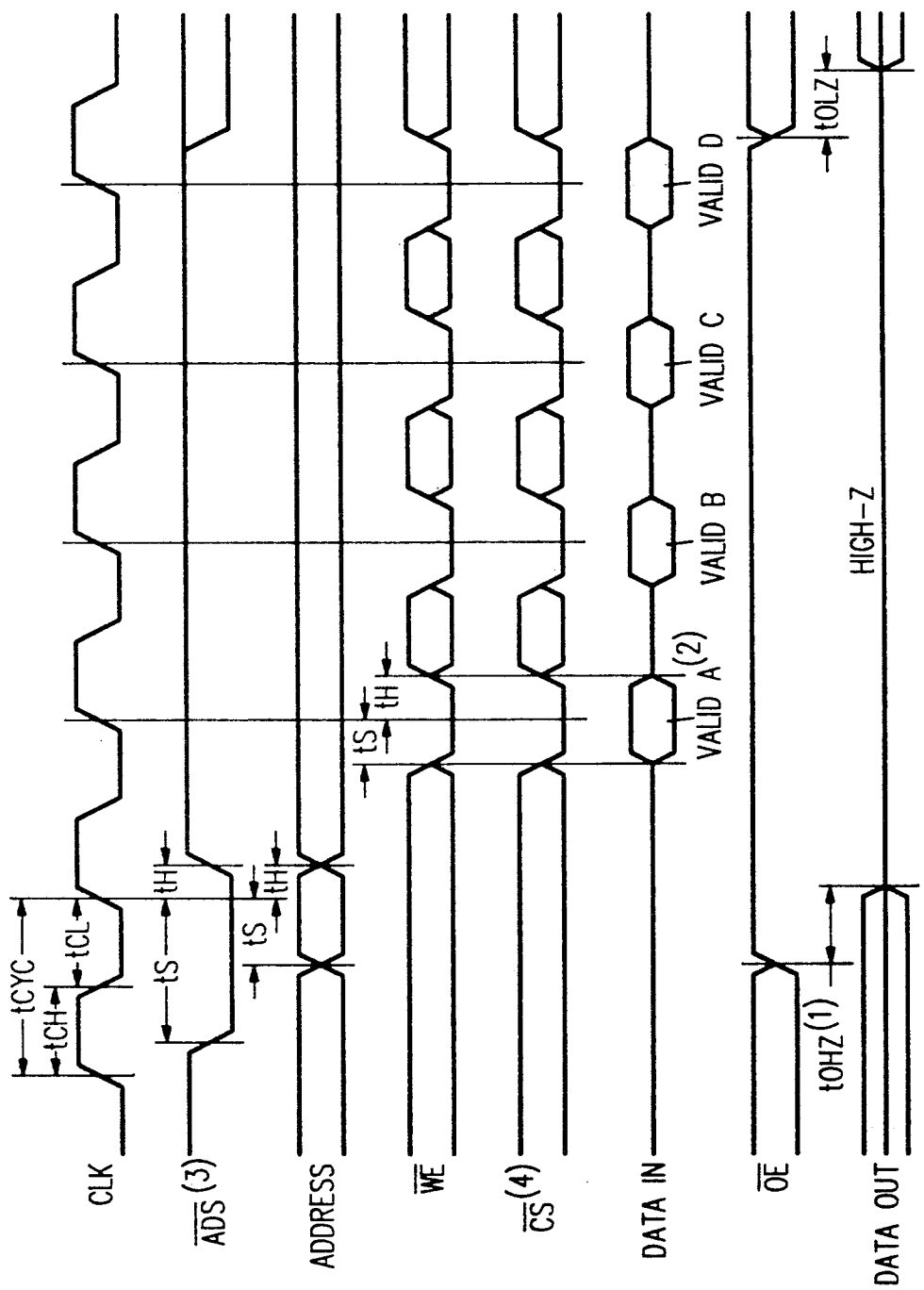
FIG. 4 is a timing diagram showing the various signals supplied to the integrated memory device of the present invention in the synchronous burst write mode.
Figure 5:
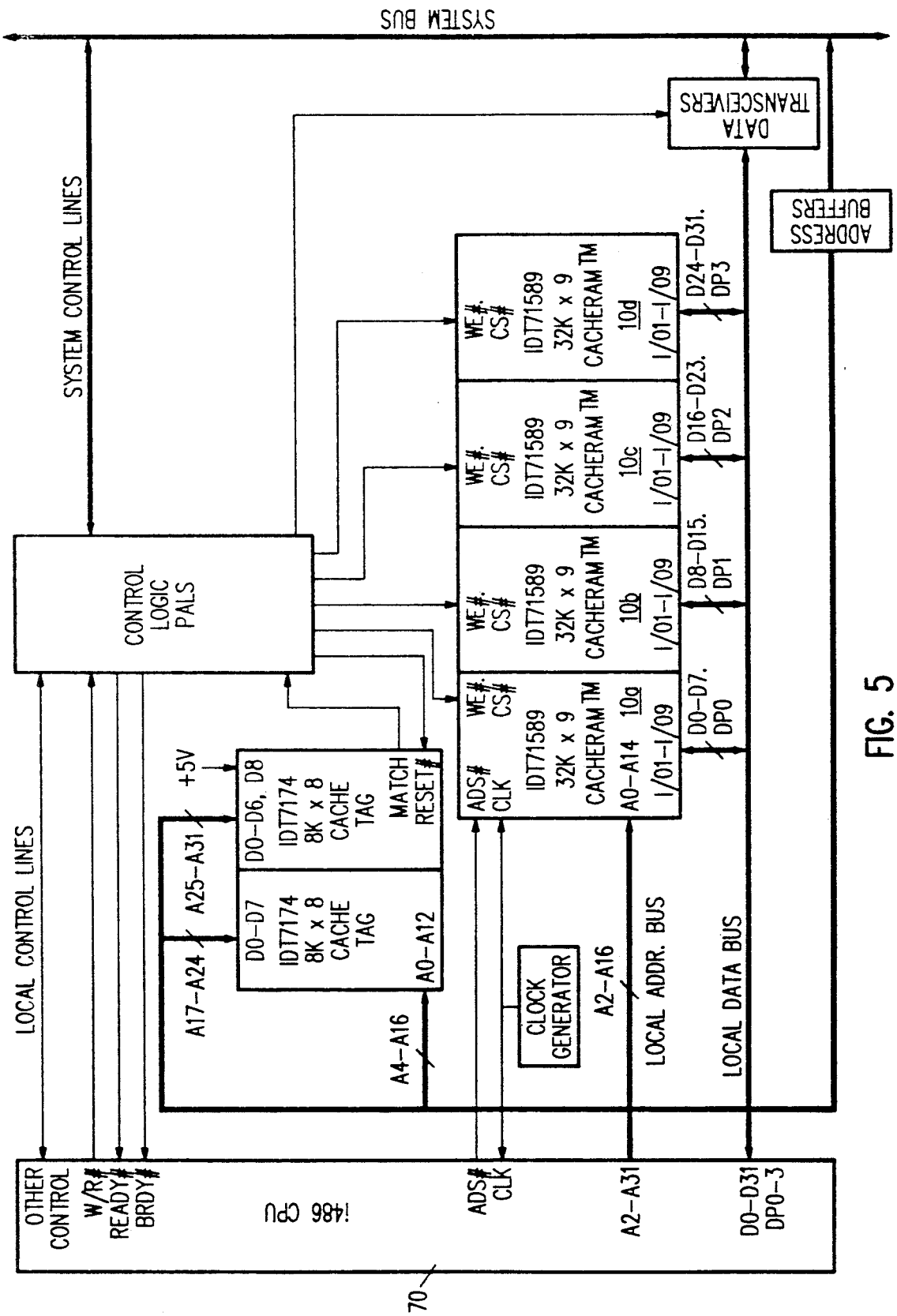
FIG. 5 is a schematic diagram showing the integrated memory device of the present invention used with a processor.

Referring to FIG. 4 there is shown a timing diagram of the various signals used in the burst write operation. In the burst write mode of operation, four input data are written into the four contiguous address locations (including the address specified on the external address lines). The write operation functions in much the same way as the burst read mode of operation. A single address is input as in the previously described cycle and four adjacent SRAM locations input data in the same sequence in which they would have been read out had this been a burst read cycle.

A timing diagram showing the various signals in the burst write operation is shown in FIG. 4, wherein the following is to be noted.

1. $\overline{OE}$ must be taken inactive before the second rising clock edge of write cycle.

2. A-Data to be written to original input address, B-Data to be written to original input address except $A_0$ is now $\overline{A_0}$, C-Data to be written to original input address except $A_1$ is now $\overline{A_1}$, D-Data to be written to original input address except $A_0$ and $A_1$ are now $\overline{A_0}$ and $\overline{A_1}$ 3. If $\overline{ADS}$ goes low during a burst cycle, a new address will be loaded and another burst cycle will be started.

4. If $\overline{CS}$ is taken inactive during a burst write cycle, the burst counter will discontinue counting until $\overline{CS}$ input again goes active. $\overline{CS}$ timing is the same as any synchronous signal when used to block writes or to stop the burst count sequence.

The integrated memory circuit device 10 of the present invention can be used as a cache memory. Referring to FIG. 4 there is shown a schematic diagram of the device 10 of the present invention used with a processor 70. In one particular embodiment, the processor 70 is an Intel i486 processor. The plurality of devices 10(a...d) are used as a cache memory for the processor 70.

Because the device 10 is a single integrated circuit memory device with synchronous write. The plurality of memory devices 10(a...d) can be used as a cache memory for the Intel i486 processor 70 with zero wait states.

In particular, the i486 can also execute burst reads, where four reads are performed in five cycles. This is one of the differences between the i486 and previous Intel CPUs, in that the i486 uses a burst-mode transfer to refill cache lines. The i486 has a cache line size of 16 bytes or 4 long words. The entire line must be replaced whenever a cache miss occurs. A burst sequence fetches four long words residing at adjacent memory locations into the i486's internal cache.

The timing on burst-read cycles and burst or no-burst write cycles is somewhat tricky. The following paragraphs describe problems faced in satisfying burst read needs of the i486. On a 25-MHz i486, address outputs are guaranteed to be valid no sooner than 22 ns after the rising edge of the system clock. For data to be captured correctly, it must be presented to the CPU at least 5 ns before the clock rising edge. With the CPU's 40-ns minimum cycle time, this means that the cache memory would need to be designed to output burst data to the CPU in 40-22-5=13 ns. At 33 MHz, this number drops to 9 ns, even without considering derating. Obviously, this speed requirement will keep designers from implementing a cache of an effective size by using prior art SRAMs that are connected between the i486's address and data buses.

Although the speed requirement of interfacing with an Intel i486 processor can be solved by using a discrete logic circuit counter (implemented, for example by a PLA) with prior art SRAM devices, the use of discrete logic, even in PLA implementation can change address timing within 7.5 ns of clock input. Knowing that the CPU requires data 5 ns before the clock's next rising edge, a 25-MHz CPU could be supported using prior art memory as slow as 40-7.5-5=27.5 ns, and a 33-MHz CPU would require 17.5-ns SRAMs. However, in the future as faster CPUs become available, this design becomes less attractive. If it is assumed that a 50-MHz CPU is used, it would still need to boast an address access of only 12 ns, less derating. This clearly will push or even exceed the state of the art within the next year or two. The present invention overcomes such problems.

Another possible problem area in the i486 concerns write-cycle timing. About 50% of the I/O cycles of a typical i486 program are write cycles. This means that cache designers need to focus as much attention on the cache's write-cycle performance as on the read-cycle performance to maximize the cache's benefits. Because a 1x clock is used, most system designers would try to generate a write pulse from the system clock. The only question is whether to use the clock-high or clock-low time to generate the write pulse.

Assuming that the clock-high time is used, data isn't guaranteed to be stable out of the CPU until 22 ns after the rising edge of the next clock cycle—the same edge that would begin the write pulse. There would be only 4 ns of overlap between the longer clock-high time and the data from the CPU, but the minimum data setup time required by even a 12-ns RAM is 8 ns. Thus, ruling out the use of the clock-high time, the clock-low time should be explored.

Now the address and data hold times become a problem. The i486 specification for this parameter is a minimum of 3 ns. If the write pulse is generated by gating the clock with any logic, the write pulse should stay valid after the i486's address and data stop being valid. Most fast SRAMs have a 0-ns data-and-address hold time. This figure would need to be a negative number to support a write pulse generated from a gated version of the clock low cycle. The present invention also overcomes this problem.

There are many advantages to the integrated memory device 10 of the present invention. First and foremost is that by using an SRAM array, the memory device 10 can be used for cache purposes. Secondly, with the synchronized write capability, the timing signals of the address and the control signals can be controlled to a finer tolerance than heretofore achieved. Finally, and most importantly, by having the burst read capability, a single memory address can result in a plurality of read cycles from immediately contiguous memory locations. This further increases the through put of the delivery of the memory device 10.

What is claimed is:

1. A single integrated memory circuit device, responsive to a clock signal, an external address signal, and an external write enable signal, said external write enable signal having two states, said memory circuit device comprising:

address register means for storing said external address signal and for generating a first internal address signal;

counter means for receiving said clock signal and for generating a second internal address signal;

address logic means for receiving said first internal address and said second internal address signal and for generating a third internal address signal;

SRAM memory array means for storing a plurality of digital binary data in an array, said SRAM memory array means being operable in a read mode wherein said memory array means receives said third internal address signal and generates an internal data signal from said array in response thereto, and being operable in a write mode wherein said memory array means receives said first internal address signal and writes an external data signal into said array;

data register means for storing said internal data signal generated by said memory array means or for storing said external data signal received by said memory circuit device external thereto; and logic means for receiving said external write enable signal and being responsive thereto wherein in one state said logic means causes said memory array means to be enabled in said write mode, synchronous with said clock signal; and wherein in the other state said logic means causes said memory array means to be operable in said read mode, generating a plurality of internal data signals for each signal external address signal received.

2. The memory circuit device of claim 1 wherein said logic means further comprising:

means for generating an internal write enable signal in one state, in response to said external write enable signal being in one state and said clock signal;
means for supplying said internal write enable signal to said memory array means; and
said memory array means responsive to said internal write enable signal being in said one state to be operable in said write mode.

3. The memory circuit device of claim 2 wherein said logic means further comprising:
means for generating an internal write enable signal in another state, in response to said external write enable signal being in another state; and
said memory array means responsive to said internal write enable signal being in said another state to be operable in said read mode.

4. A single integrated memory circuit device comprising:
means for receiving an external address signal supplied to said memory circuit device, external thereto;
means for receiving a clock signal supplied to said memory circuit device, external thereto;
means for receiving an external write enable signal, supplied to said memory circuit device, external thereto, said external write enable signal having two states;
address register means for storing said external address signal;
SRAM memory array means for storing a plurality of digital binary data in an array;
said memory array means being operable in two states and is responsive to an internal write enable signal having said two states;
said memory array means in a read state is responsive to an internal address signal and generates a plurality of internal data signals from said array in response thereto, and in a write state is responsive to said internal address signal and stores said internal data signal into said array; and
logic means responsive to said clock signal, said external address signal, and said external write enable signal, and for generating said internal write enable signal and said internal address signal; wherein said logic means in one state generates said internal write enable signal synchronous with said internal address signal and causes said memory array means to be operable in said write state, and wherein said logic means in another state generates a plurality of internal address signals in response to a single external address signal received and causes said memory array means to be operable in said read state.

5. The memory circuit device of claim 4 wherein said logic means further comprising:
counter means for receiving said clock signal and for generating an incrementing signal; and
means for combining said incrementing signal with said external address signal to produce said internal address signal.

6. The memory circuit device of claim 4 wherein said logic means further comprising:
means for receiving said external address signal from said address register means and for supplying said external address signal to said combining means.

7. The memory circuit device of claim 6 wherein said combining means is an exclusive OR gate.

8. An integrated cache memory device for use with a processor supplying an external address signal, a clock signal and an external write enable signal; said memory device comprising:
address register means for storing said external address signal and for providing an internal address signal;
static random access memory means for storing a plurality of digital binary data in an array, said memory means being operable in a read mode and in a write mode;
logic means responsive to said external write enable signal, said internal address signal, and said clock signal, and for causing said memory means to be operable in said write mode; said logic means further for receiving said internal address signal and responsive to said external write enable signal and said clock signal for causing said memory means to be operable in said read mode for providing a plurality of digital binary data from said array in response to a single external address signal.

* * * * *

UNITED STATES PATENT AND TRADEMARK OFFICE
CERTIFICATE OF CORRECTION

PATENT NO. : 5,126,975
DATED : June 30, 1992
INVENTOR(S) : James E. Handy, et al.

It is certified that error appears in the above-indentified patent and that said Letters Patent is hereby corrected as shown below:

Column 8, Claim 1, line 21, replace "first" with --third--.
Column 8, Claim 1, line 36, replace "signal" with --single--.
Column 9, Claim 4, line 23, replace "said internal" with --an external--.

Signed and Sealed this

Ninth Day of January, 1996

Attest:

BRUCE LEHMAN

*Attesting Officer*              *Commissioner of Patents and Trademarks*

UNITED STATES PATENT AND TRADEMARK OFFICE
CERTIFICATE OF CORRECTION

PATENT NO. : 5,126,975
DATED : June 30, 1992
INVENTOR(S) : James E. Handy, et al.

It is certified that error appears in the above-indentified patent and that said Letters Patent is hereby corrected as shown below:

In Claim 1, line 21, replace "first" with --third--.

In Claim 1, line 36, replace "signal external" with --single external--.

In Claim 4, line 23, replace "stores said internal" with --stores an external--.

This Certificate supercedes Certificate of Correction issued 9 January 1996.

Signed and Sealed this

Sixteenth Day of July, 1996

Attest:

BRUCE LEHMAN

*Attesting Officer*   *Commissioner of Patents and Trademarks*